United States Patent
Tamura et al.

(10) Patent No.: US 8,936,405 B2
(45) Date of Patent: Jan. 20, 2015

(54) MULTI-CHANNEL OPTICAL RECEIVER MODULE

(75) Inventors: Kenichi Tamura, Hitachi (JP); Masahiko Kobayashi, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 263 days.

(21) Appl. No.: 11/717,391

(22) Filed: Mar. 13, 2007

(65) Prior Publication Data

US 2007/0269167 A1    Nov. 22, 2007

(30) Foreign Application Priority Data

May 19, 2006 (JP) .................................. 2006-140427

(51) Int. Cl.
*H04B 10/06* (2006.01)
*G02B 6/36* (2006.01)
(Continued)

(52) U.S. Cl.
CPC ............ *H01L 27/1443* (2013.01); *H01L 23/66* (2013.01); *H01L 25/167* (2013.01); *H01L 21/0203* (2013.01); *H01L 24/45* (2013.01); *H01L 2223/6611* (2013.01); *H01L 2224/45015* (2013.01); *H01L 2224/45144* (2013.01); *H01L 2224/48137* (2013.01); *H01L 2224/48195* (2013.01); *H01L 2224/49175* (2013.01); *H01L 2924/0102* (2013.01); *H01L 2924/01079* (2013.01); *H01L 2924/14* (2013.01); *H01L 2924/15312* (2013.01); *H01L 2924/16152* (2013.01); *H01L 2924/19041* (2013.01); *H01L 2924/20752* (2013.01); *H01L 2924/30107* (2013.01); *H01L 24/48* (2013.01); *H01L 24/49* (2013.01); *H01L 2924/01019* (2013.01)

USPC .................................. 385/92; 385/88; 398/202

(58) Field of Classification Search
USPC ...................... 385/88–94; 398/202, 208, 210; 257/414, 428, 431, 433, 459
See application file for complete search history.

(56) References Cited

U.S. PATENT DOCUMENTS 6,585,426 B2 * 7/2003 Shuto et al. ..................... 385/90
6,949,731 B2 * 9/2005 Ito .............................. 250/214 R
(Continued)

FOREIGN PATENT DOCUMENTS

| JP | 08-116136 | 5/1996 |
| JP | 2002-353493 | 12/2002 |
| JP | 2005-250117 | 9/2005 |

OTHER PUBLICATIONS

Japanese Official Action dated Sep. 27, 2011 from related application JP 2007-051151.

*Primary Examiner* — Uyen Chau N Le
*Assistant Examiner* — John M Bedtelyon
(74) *Attorney, Agent, or Firm* — Scully, Scott, Murphy & Presser, PC

(57) ABSTRACT

A multi-channel optical receiver module, includes a light-receiving element array, the light-receiving element array including multiple light-receiving elements; an amplifier disposed adjacent the light-receiving element array, the amplifier amplifying an output of a light-receiving element; a wiring relay submount disposed adjacent the amplifier; two wires for carrying a differential signal and being wired in parallel to one another and being connected between the wiring relay submount and the amplifier; an output pin; and another wire, the another wire being connected between the output pin and the wiring relay submount.

16 Claims, 6 Drawing Sheets

(51) Int. Cl.
  H01L 27/144 (2006.01)
  *H01L 23/66* (2006.01)
  *H01L 25/16* (2006.01)
  *H01L 21/02* (2006.01)
  *H01L 23/00* (2006.01)

(56) References Cited

U.S. PATENT DOCUMENTS 7,073,959 B2 * 7/2006 Baek et al. ............... 385/92
2005/0100293 A1 * 5/2005 Warashina et al. ............ 385/92

* cited by examiner

--PRIOR ART--

--PRIOR ART--

--PRIOR ART--

MULTI-CHANNEL OPTICAL RECEIVER MODULE

The present application is based on Japanese Patent Application No. 2006-140427 filed on May 19, 2006, the entire contents of which are incorporated herein by reference.

BACKGROUND OF THE INVENTION

1. Field of the Invention

This invention relates to a multi-channel optical receiver module and, in particular, to a multi-channel optical receiver module in which crosstalk can be reduced.

2. Description of the Related Art

Conventionally, communication signals of multiple channels which have different optical wavelengths are multiplexed to allow the propagation of the multi-channel communication signals in a single optical fiber.

Then, a multi-channel receiver module receives the multiplexed optical signal by itself.

As shown in FIG. 3, a multi-channel optical receiver module includes a receptacle 31 for leading light from an optical fiber (not shown) as a transmission path, a reflective member 32 facing to an optical path from the receptacle 31 at a predetermined angle, a reflective branching filter 33 facing to the reflective member 32 at a predetermined angle and for branching the optical signals, a line-type light-receiving element array 34 including multiple light-receiving elements for receiving the branched optical signals which are entering into the array with slightly different optical paths from each other, and a can-type receiver module 35 for mounting the light-receiving element array 34. Since electric power of a received light signal outputted from the light-receiving element (array 34) is weak, an amplifier IC chip (not shown) for amplifying the received light signal is incorporated inside of the can-type receiver module 35, so that an output pin 36 of the can-type receiver module 35 can output the signal amplified by the amplifier IC chip. An example of the amplifier IC chip may be a transimpedance amplifier to convert a received current into a voltage. The transimpedance of differential signal in the amplifier IC chip is 5 to 10 kΩ.

In addition, the multi-channel optical receiver module does not always exchange the multiplexed optical signal with only one transmission path. The multi-channel optical receiver module can exchange optical signals with multiple optical transmission paths, respectively. In this case, semiconductor members can be combined and integrated such that the line-type light-receiving element array 34 including the multiple light-receiving elements can be mounted on the can-type optical receiver module 35.

The related art to the invention is, for example, JP-A-8-116136.

An output signal from the amplifier is a differential signal. Essentially, the differential signal can prevent noise from being input or output when two output signal lines for the differential signal are disposed in parallel.

However, it is difficult to dispose in parallel the output signal lines for carrying the differential signal in the can-type receiver module. That is, it is difficult to make wires parallel since the output pins are disposed along the circumference of the can-type receiver module when the wires are provided to wire-bond linearly a differential output pin terminal of the amplifier IC chip to the output pin. Thus, it is difficult to prevent noise from being output from the wire due to the output of the amplifier IC chip in the can-type receiver module 35.

Within the can-type optical receiver module 35, received light output is transmitted through a signal line connecting the light-receiving element 34 and the amplifier IC chip. Electric power (i.e., received light output) in the line of the light-receiving element is typically very low, and there is a difference in electric power corresponding to the amplifier gain between the received light output and the output of the amplifier IC chip. Therefore, the former output is likely to be greatly affected by noise. That is, when one channel light-receiving element receives the noise from the differential output of another channel light-receiving element, crosstalk will occur. When the crosstalk occurs, a receiving sensitivity of the one channel light-receiving element is substantially reduced, thereby leading to errors.

It is noted that, although it may be possible technically to devise a pin arrangement such that the output pins are positioned to avoid noise output and input, such a pin arrangement is practically infeasible because of restriction of pin arrangement in fabrication.

SUMMARY OF THE INVENTION

In view of the foregoing and other exemplary problems, drawbacks, and disadvantages of the conventional methods and structures, an exemplary feature of the present invention is to provide a multi-channel optical receiver module in which crosstalk can be reduced.

According to one exemplary aspect of the invention, a multi-channel optical receiver module includes:

a light-receiving element array, the light-receiving element array including multiple light-receiving elements;

an amplifier disposed adjacent to the light-receiving element array, the amplifier amplifying an output of a light-receiving element;

a wiring relay submount disposed adjacent to the amplifier;

two wires for carrying a differential signal and being wired in parallel to one another and being connected between the wiring relay submount and the amplifier;

an output pin; and another wire, said another wire being connected between the output pin and the wiring relay submount.

In the above exemplary invention, many exemplary modifications and changes can be made.

For example, the wiring relay submount may be disposed in a proximity of a virtual straight line connected between a pair of two output pins.

Further, the wiring relay submount may be an electronic component a noise amplitude of the two wires to be smaller than that of the another wire.

Additionally, the electronic component used as the wiring relay submount may be structured and placed in relation to the amplifier such that the two wires are disposed in parallel to one another.

Still further, the electronic component used as the wiring relay submount may be a resistive element.

Yet additionally, the electronic component used as the wiring relay submount may comprise one end electrically connected to the amplifier, and another end electrically connected to a fixed electric potential.

Further, the electronic component used as the wiring relay submount may be a capacitative element.

Additionally, a wire length L1 between the wiring relay submount and the amplifier and a wire length L2 between the output pin and the wiring relay submount may have a relationship of L1>L2 in a case of no less than one channel in a multi-channel receiver module.

According to another exemplary aspect of the invention, a submount assembly includes:

a wiring relay submount including a wire for being coupled to an output pin of said multi-channel optical receiver module; and a pair of wires, coupled to said wiring relay submount, disposed in parallel to one another for carrying a differential signal from an amplifier of said multi-channel optical receiver module.

According to another exemplary aspect of the invention, a multi-channel optical receiver module includes:

a light-receiving element array including a plurality of light-receiving elements;

means for amplifying an output of a light-receiving element;

a wiring relay submount; and means for coupling said amplifying means and said wiring relay submount, said coupling means including means for reducing noise in a differential signal carried by said coupling means.

The above exemplary modifications may be made alone or in any combination thereof.

With the unique and unobvious structures of the present invention, crosstalk in a multi-channel optical receiver module can be reduced.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF THE PREFERRED EMBODIMENTS

Figure 1:
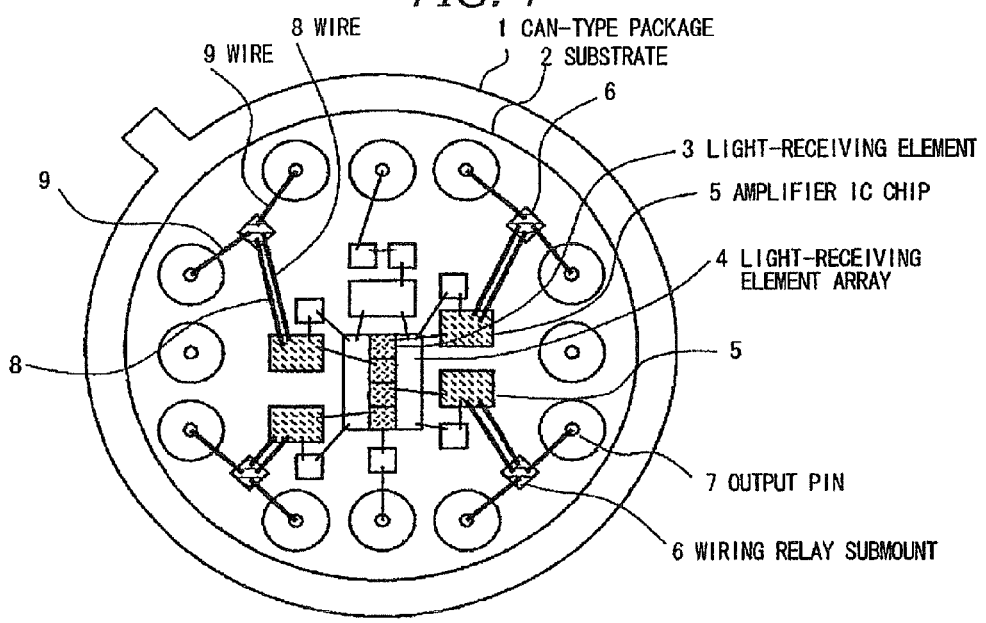
FIG. 1 is an internal arrangement view showing a can-type package of a multi-channel optical receiver module in a first exemplary embodiment according to the invention.

Referring now to the drawings, and more particularly to FIGS. 1-12, there are shown exemplary embodiments of the method and structures according to the present invention.

Exemplary Embodiment

As shown in FIG. 1, a multi-channel optical receiver module according to the present invention includes a substrate 2 mounted on a bottom part of a can-type package 1 and combined with a bottom face of the can-type package 1, a light-receiving element array 4 mounted on the substrate 2, wherein the light-receiving element array 4 includes multiple light-receiving elements 3 at the shaft center of the can-type package 1, amplifier IC chips 5 mounted outside the light-receiving element array 4, wherein the amplifier IC chips 5 each amplify the output of each of the light-receiving elements 3, wiring relay submounts 6 each mounted outside each of the amplifier IC chips 5 to relay a differential signal therethrough by being each wire-connected to the amplifier IC chips 5, two wires 8 for the differential signal to connect each of the wiring relay submounts 6 to the corresponding amplifier IC chip 5, and a wire 9 to connect each output pin 7 of the can-type package 1 to the corresponding wiring relay submount 6.

The multi-channel optical receiver module shown exemplarily herein is used for four channels and includes four light-receiving elements 3 of a light-receiving element array, four amplifier IC chips 5, and four wiring relay submounts 6. Although for brevity and clarity a reference number is not shown for all of the above parts in the accompanying drawings, the same hatching is used for the same part. Meanwhile, the multi-channel optical receiver module of the invention is not specifically limited by the abovementioned number of channels (i.e., four channels).

Although the amplifier IC chips 5 are respectively disposed in the proximity to both sides of the light-receiving element array 4 and substantially surround the light-receiving element array 4, the amplifier IC chips 5 are respectively wire-connected to the output portion of the nearest light-receiving element 3 thereto, and can amplify the output of the light-receiving element 3.

The output pin 7 of the can-type package 1 is disposed on the outer most circumference of the substrate 2. The twelve output pins 7 in total are disposed at a right side, left side, upper side, and lower side. Each of the sides includes the three output pins 7, as shown in FIG. 1. The output pins 7 located at the center of the upper side and the lower side are power terminals. The output pins 7 located at the center of the right side and the left side are typically not used. The output pins 7 located at both ends of each side are used for outputting a differential signal. The output pins 7 for outputting differential signals of the same channel, which are supplied from the single light-receiving element 3, are adjacently disposed to each other.

Figure 4:
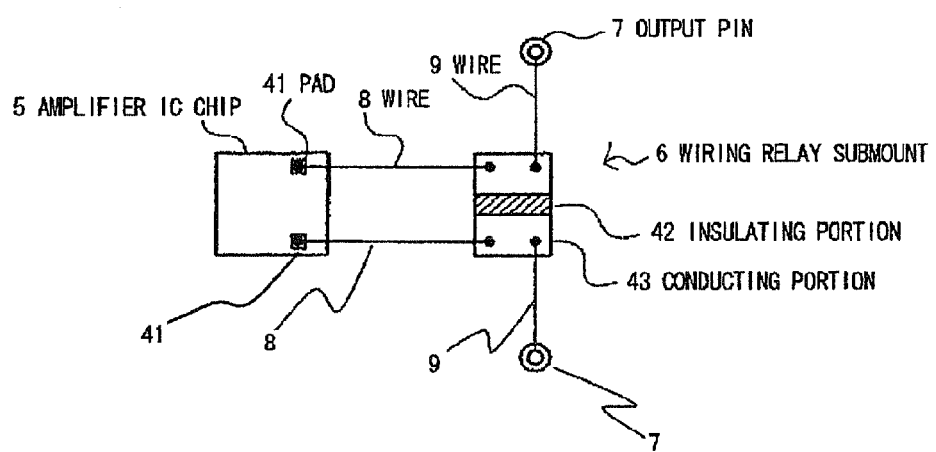
FIG. 4 is a partially enlarged view showing the multi-channel optical receiver module of FIG. 1.

Looking at a pair (i.e., one channel) of the amplifier IC chips 5 and the wiring relay submount 6, as shown in FIG. 4, two pads 41 are formed on the amplifier IC chip 5, and are used for bonding the wires 8 to communicate a differential signal. Two conducting portions 43 are formed on the wiring relay submount 6, and are divided by an insulating portion 42. The two conducting portions 43, 43 of the wiring relay submount 6 and the two pads 41, 41 of the amplifier IC chip 5 are structured and placed such that one virtual straight line connecting the conducting portion 43 and the pad 41 opposed to each other is made parallel to the other virtual straight line connecting the conducting portion 43 and the pad 41 opposed to each other. Thus, the one wire 8 for the differential signal can be disposed parallel to the other wire 8 for the differential signal. As an example, the wire 8 may be about φ=25 μm in diameter and made of Au.

Meanwhile, since the wiring relay submount 6 is located on a virtual (imaginary) straight line connecting the two output pins 7, the wire 9 is disposed between the output pin 7 and the wiring relay submount 6 nearly along the virtual straight line. Exemplarily, the submount 6 is substantially equidistant to and between adjacent output pins 7.

It is noted that in the multi-channel optical receiver module of the present invention, two wires 8, which are used for communicating a differential signal, are disposed in parallel (or substantially in parallel) between the wiring relay submount 6 to the amplifier IC chip 5. Additionally, a distance (spacing) between these two parallel wires 8 is adequately narrower than a distance between any two wires 8 not parallel to each other. In this exemplary embodiment, the distance (spacing) between these two parallel wires 8 is about 100 μm to 200 μm. Each of the wiring relay submounts 6 may be disposed dispersively in four directions and surroundingly on an outer circumferential portion of each amplifier IC chip 5. Each amplifier IC chip 5 is wire-connected to the corresponding wiring relay submount 6 which is located in a direction radially outward from the amplifier IC chip 5. Thus, all of the wires 8 are extended in directions away from the light-receiving element array 4.

The wires 9 are disposed between the wiring relay submount 6 and two output pins 7 adjacent to the wiring relay submount 6. Since the wiring relay submount 6 is located exemplarily nearly at the intermediate position between the two output pins 7 of the same channel and slightly nearer the center of the can-type package 1 in relation to the circumference, the two wires 9 extend in substantially opposite directions from the wiring relay submount 6. As mentioned, since the wiring relay submount 6 is positioned substantially at the midpoint of the two adjacent output pins 7, the lengths of wires 9 are substantially the same.

According to the present invention, a pair of wires 8 communicating the differential signal exemplarily is disposed parallel and has a narrow spacing therebetween. Therefore, a noise (i.e., magnetic field generated by signal current) generated from one wire 8 of the pair of wires 8 and a noise (i.e., magnetic field generated by signal current) generated from the other wire 8 of the pair have substantially a same intensity, same generation position, and opposite polarity (i.e., opposite in direction of magnetic field generated by signal current). Thus, these noises cancel each other by superposition (i.e., noise canceling effect), so that the noise generated from wires 8 is nullified.

Moreover, since these wires 8 are exemplarily disposed nonparallel to a wire connecting the light-receiving element 3 and the amplifier IC chip 5, a received light output is not affected by the noise generated from the wire 8.

On the other hand, although each differential signal flows to a dispersive direction through the wire 9, the wire 9 is far from light-receiving element 3. Thus, the received light output is hardly affected (if at all) by any noises which might be generated from the wire 9. Hence, exemplarily the wires 8 are extended in parallel for as long as possible so that the wiring relay submount 6 can be disposed to allow the nonparallel wire section to be far from the light-receiving element 3.

For at least one channel of the multi-channel receiver module, exemplarily a wire length L1 between the wiring relay submount 6 and the amplifier IC chip 5 and a wire length L2 between the output pin 7 and the wiring relay submount 6 have a relationship of L1>L2.

Figure 2:
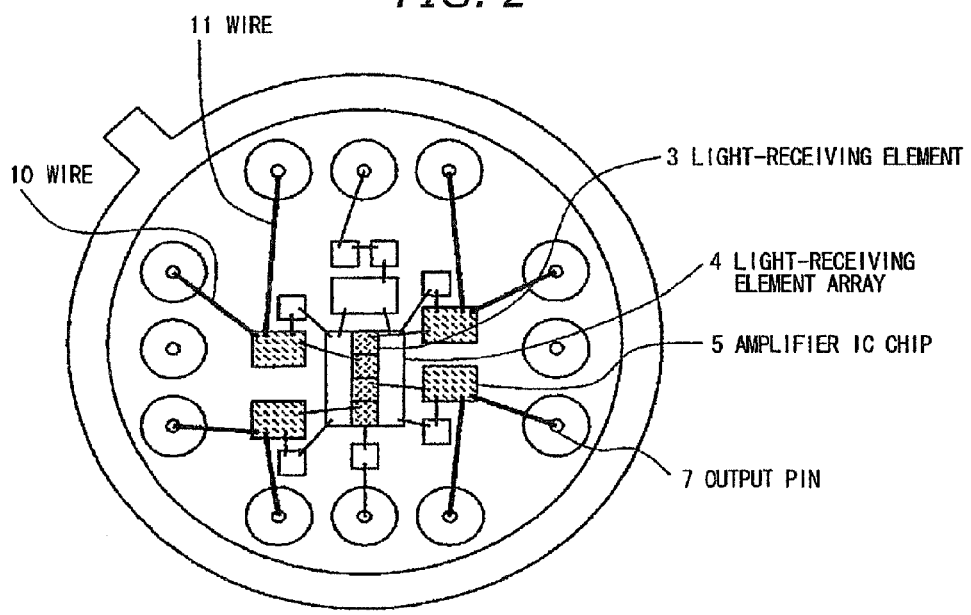
FIG. 2 is an internal arrangement view showing a can-type package of a conventional multi-channel optical receiver module.
Figure 3:
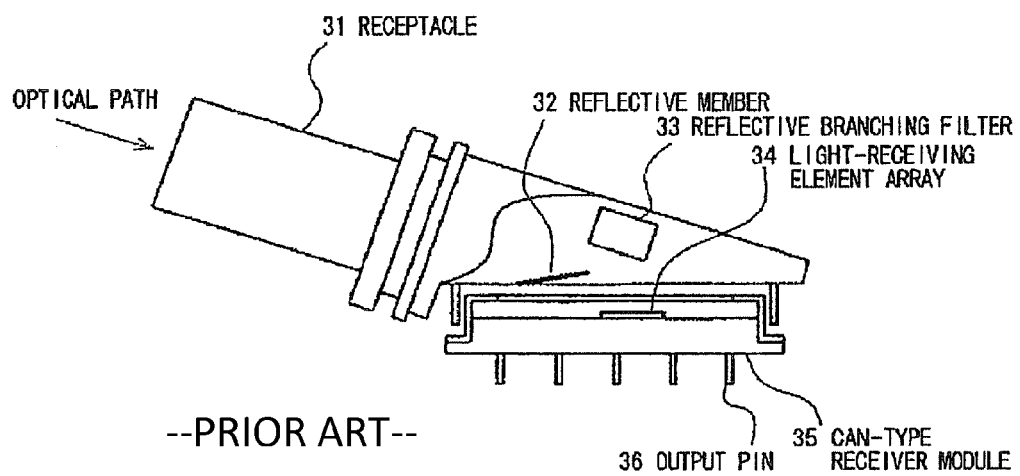
FIG. 3 is a partially broken side view showing the conventional multi-channel optical receiver module.

For comparison, a conventional multi-channel optical receiver module is shown in FIG. 2. In FIG. 2, disposal of the light-receiving element 3, the amplifier IC chip 5, and the output pin 7 is same as that in FIG. 1. However, since there is no idea of relaying a wiring for a differential signal by the wiring relay submount 6, as shown in FIG. 2 a wire 10 and a wire 11 are extended dispersively from the amplifier IC chip 5 and connected to the output pin 7. Noise is output from the wire 10 and the wire 11. Thus, in the conventional multi-channel optical receiver module it is difficult to prevent the crosstalk, whereas in the present invention exemplarily shown in FIG. 1 two wires 8 are disposed in parallel between the amplifier IC chip 5 and the wiring relay submount 6, so that the crosstalk can be reduced thereby.

Figure 5:
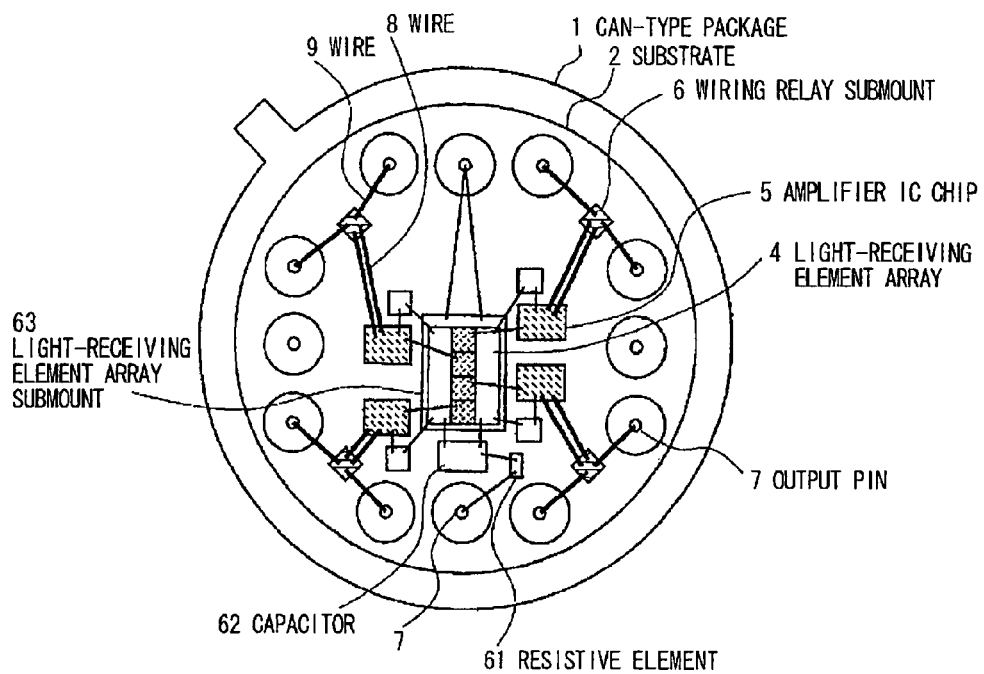
FIG. 5 is an internal arrangement view showing a can-type package of a multi-channel optical receiver module in another exemplary embodiment according to the invention.

Although a multi-channel optical receiver module shown in FIG. 5 is substantially similar to that shown in FIG. 1, a wire is connected to one side end of a resistive element 61 from a certain output pin 7, a wire is connected to a capacitor 62 from the opposite side of the resistive element 61, and a wire is connected to a light-receiving element array 4 from the capacitor 62. The light-receiving element array 4 is mounted on the light-receiving element array submount 63.

Figure 6A:
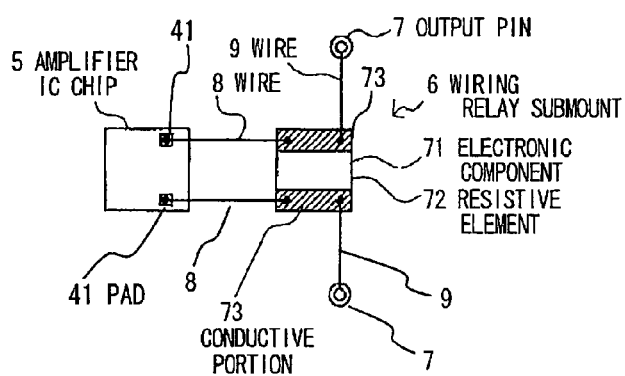
FIG. 6A is a partially enlarged view showing another exemplary embodiment of multi-channel optical receiver module of FIG. 1.
Figure 6B:
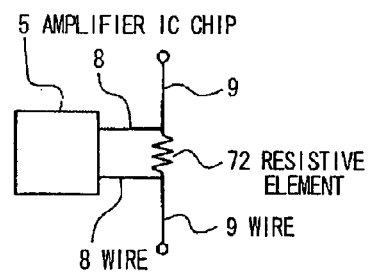
FIG. 6B is an equivalent circuit view of FIG. 6A.

In an exemplary embodiment shown in FIGS. 6A and 6B, which is discussed hereafter, a resistive element 72, which composes an electronic component 71 used as the wiring relay submount 6, is disposed such that one of the wires 8 for the differential signal is parallel to the other of the wires 8 for the differential signal.

As shown in FIGS. 6A and 6B, the resistive element 72 may be formed as one chip resistor, in which a thin-film resistor is formed between two conductive portions 73, and a wire 8 and a wire 9 are bonded to each of the conductive portions 73. The two conducting portions 73, 73 of the resistive element 72 and the two pads 41, 41 of the amplifier IC chip 5 are structured and placed such that one virtual straight line connecting the conducting portion 73 and the pad 41 opposed to each other is made parallel to the other virtual straight line connecting the conducting portion 73 and the pad 41 opposed to each other. Thus, the one wire 8 for the differential signal can be disposed parallel to the other wire 8 for the differential signal.

Hereby, since the resistance is inserted between two differential signal electric potentials, each differential signal amplitude can be reduced, so that the noise can be also reduced.

Figure 7A:
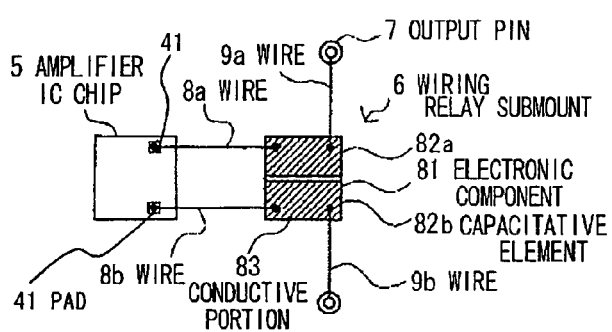
FIG. 7A is a partially enlarged view showing another exemplary embodiment of multi-channel optical receiver module of FIG. 1.
Figure 7C:
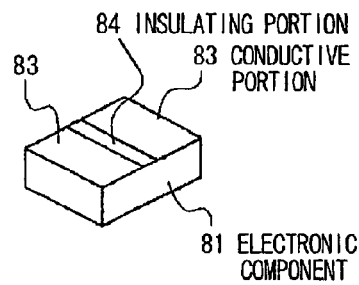
FIG. 7C is a partially perspective view of FIG. 7A.
Figure 7B:
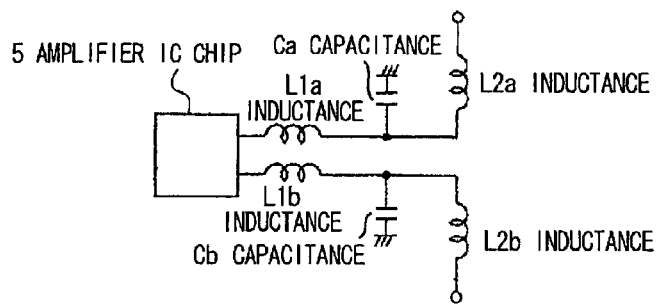
FIG. 7B is an equivalent circuit view of FIG. 7A.

In an exemplary embodiment shown in FIGS. 7A to 7C, two capacitative elements 82a, 82b, which may be an electronic component 81 used as a wiring relay submount 6, are formed on one chip. The two capacitative elements 82a, 82b of the wiring relay submount 6 and the two pads 41, 41 of the amplifier IC chip 5 are structured and placed such that one virtual straight line connecting the capacitative element 82a and the pad 41 opposed to each other is made parallel to the other virtual straight line connecting the capacitative element 82b and the pad 41 opposed to each other. Two conductive portions 83 formed sandwiching an insulating portion 84 on an upper surface of the electronic component 81, may be electrodes of the capacitative elements 82a, 82b, the wire 8a and a wire 9a may be wire-bonded to one conductive portion 83, and the wire 8b and a wire 9b may be wire-bonded to the other conductive portion 83. Exemplarily, the two conductive portions 83 may have a same area, the wire 8a and the wire 8b may have a same length, and the wire 9a and the wire 9b may have a same length. Further, the upper surface of the electronic component 81 electrically connects through the wires 8a, 8b to the amplifier IC ship 5. The lower surface of the electronic component 81 electrically connects through a solder etc. to a fixed electric potential such as a ground (not shown) formed on the substrate 2 of the package 1. The fixed electric potential may be a power source other than the ground.

FIG. 7B shows an equivalent circuit of the exemplary embodiment of FIG. 7A. In FIG. 7B, L1a is a parasitic inductance of the wire 8a, L2a is a parasitic inductance of the wire 9a, L1b is a parasitic inductance of the wire 8b, L2b is a parasitic inductance of the wire 9b, Ca is a capacitance of the capacitive element 82a, and Cb is a capacitance of the capacitive element 82b. As shown by the equivalent circuit in FIG. 7B, since noise filters (which are each composed of L1a and Ca, L1b and Cb, L2a and Ca, and L2b and Cb) are formed for each differential signal, noises from the wires 8a, 8b, 9a, and 9b can be reduced thereby. Thus, noise can be further reduced in cooperation with the noise canceling effect (as mentioned earlier) obtained at the parallel section of the wires 8a, 8b.

An electronic component 81 used in the exemplary embodiment shown in FIGS. 7A to 7C may be one chip mounting two capacitive elements 82 thereon. As an exemplary embodiment of such an electronic component 81, a capacitor shown in FIG. 8 is described hereinafter.

Figure 8:
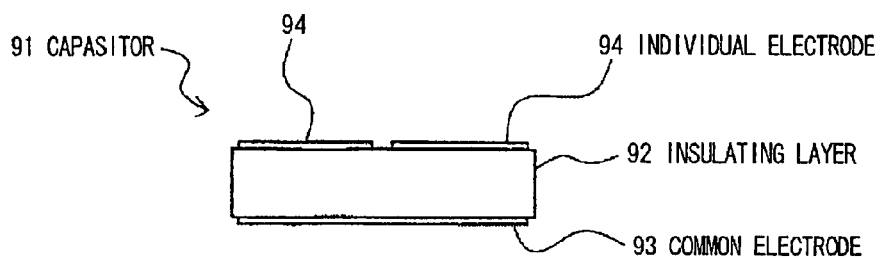
FIG. 8 is a side cross sectional view showing an exemplary capacitor according to the invention.

A capacitor 91 shown in FIG. 8 is a twin parallel plate capacitor formed as a chip component. That is, a common electrode 93 is formed on a lower surface of an insulating layer 92 by covering almost the entire lower surface thereby. Two individual electrodes 94 are formed on an upper surface of the insulating layer 92 by covering almost half of the upper surface respectively, and keeping out of contact with each other.

This capacitor 91 has a capacitance because the common electrode 93 and the individual electrode 94 are parallel plates. Moreover, the capacitor 91 can be used as the electronic component 81 shown in FIG. 7 by connecting the common electrode 93 to a ground pattern of the substrate 92.

Figure 9:
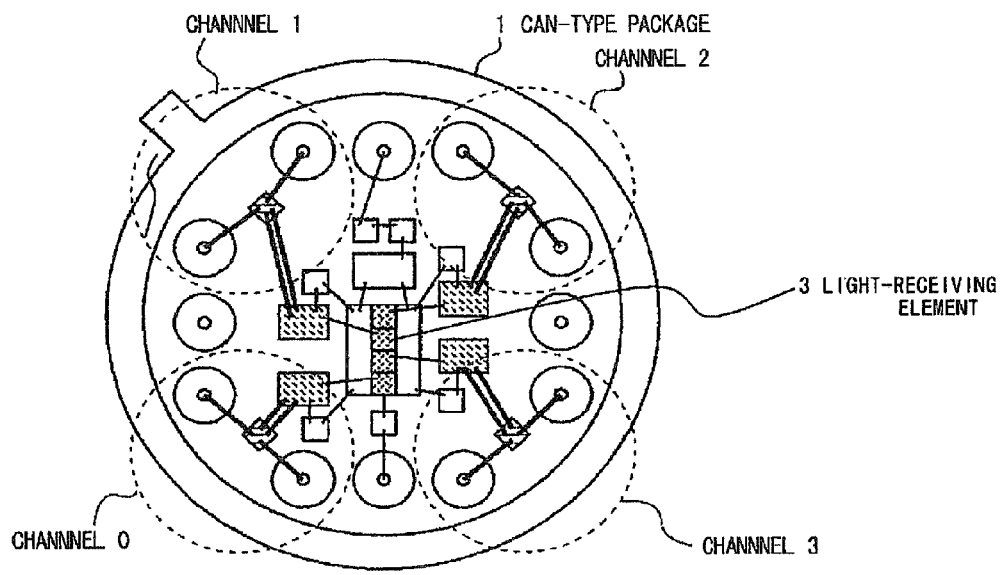
FIG. 9 is an exemplary arrangement view showing a channel division of the multi-channel optical receiver module in a first exemplary embodiment according to the present invention.

As shown in FIG. 9, each pair of two output pins 7 having a same channel in the multi-channel optical receiver module is referred to as "channel 0" to "channel 3". When a binary optical signal which has a pattern based on pseudo-random number having logic "0" and logic "1" is input to a light-receiving element of one channel, an error rate is determined by measuring whether an electrical signal in output pin 7 indicates logic "0" or logic "1" correctly. The error rate is defined as a bit error rate (BER). When an intensity of the optical signal which is input is changed to multiple levels, multiple levels of received light intensities can be provided. When the bit error rate is measured in each case of these multiple levels of the received light intensities, a characteristic of the bit error rate may be plotted graphically against the received light intensity.

In this case, when a binary optical signal having another pattern which is different from the pattern described above and based on the pseudo-random number having logic "0" and logic "1" is input to a light-receiving element of another channel, due to electrical crosstalk between the two channels, S/N (signal-to-noise) ratio decreases, and an electrical signal having logic "0" or logic "1" is disturbed. As a result, a rate at which the electrical signal in output pin 7 does not indicate logic "0" and logic "1" correctly (i.e. the characteristic of the bit error rate against the received light intensity), is changed.

Figure 10:
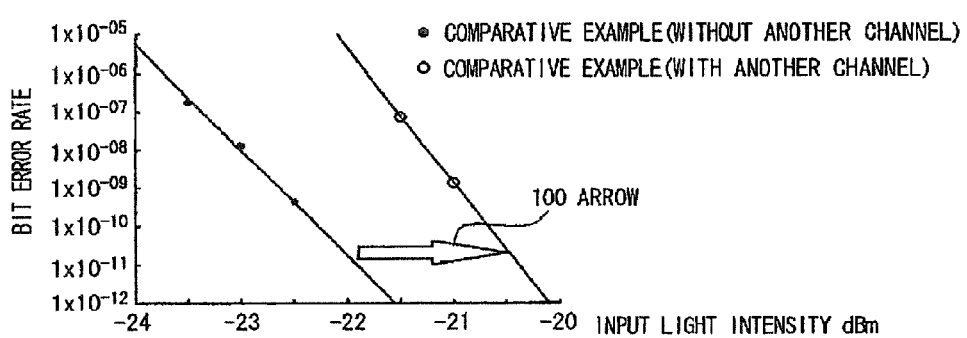
FIG. 10 is a characteristic view of a bit error rate (BER) plotted against an input light intensity provided by an actual measurement in the conventional multi-channel optical receiver module according to FIG. 2.
Figure 11:
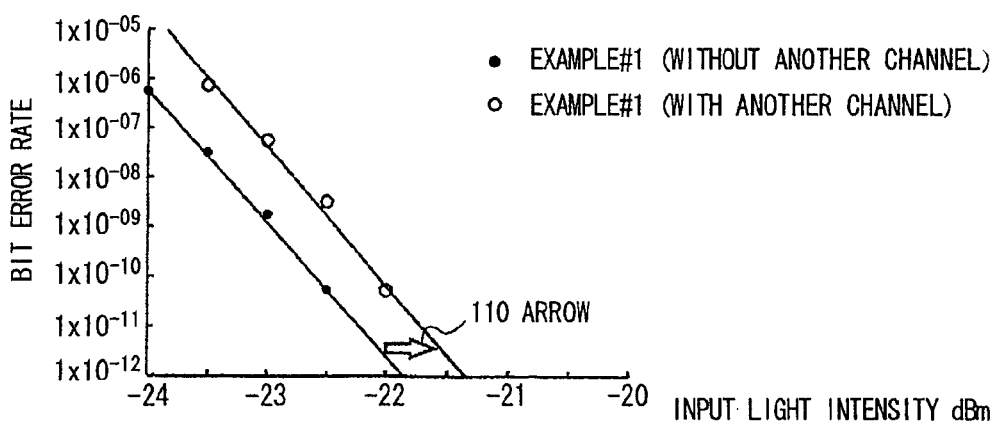
FIG. 11 is a characteristic view of a bit error rate (BER) plotted against an input light intensity provided by an actual measurement in the multi-channel optical receiver module according to FIG. 9, which is referred to as "example#1" herein.
Figure 12:
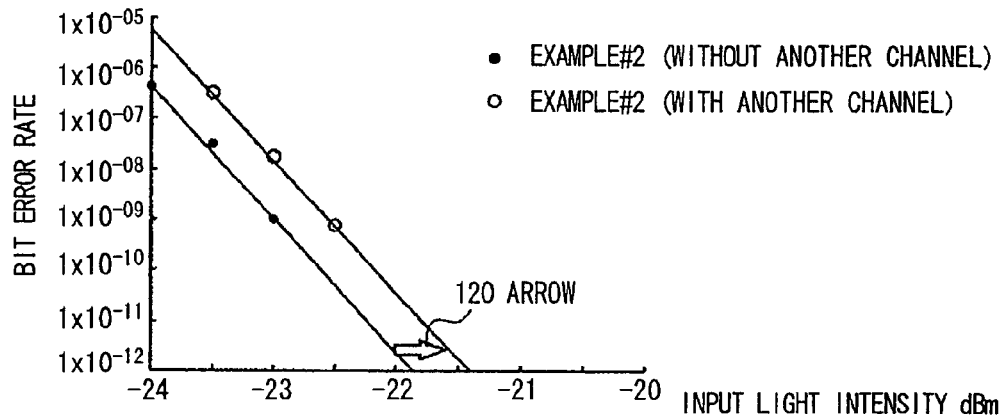
FIG. 12 is a characteristic view of a bit error rate (BER) plotted against an input light intensity provided by an actual measurement in the multi-channel optical receiver module according to FIG. 9, which is referred to as "example#2" herein.

FIGS. 10 to 12 are graphs illustrating the bit error rate plotted against an input light intensity, in which horizontal axis (X-axis) is the input light intensity and the vertical axis (Y-axis) is the bit error rate. As an evaluation signal, an NZR (Non-return-to-zero) signal having a velocity of 3.125 Gbps is input in the form of PRBS (pseudo-random bit sequence) $2^7-1$. Each graph indicates a result measured about a comparative example, and examples #1 and #2 in cases that an optical signal is input to only one measured channel ("without another channel") and that an optical signal is input to a measured channel and a different optical signal is input to another channel (i.e., "with another channel").

For example #1, the wiring relay submount 6 is disposed as shown in FIG. 1, for the example #2 the resistive element 72 is disposed as shown in FIG. 6B, and for the comparative example the submount is not disposed as shown in FIG. 2.

As shown in FIG. 10, in the comparative example, although a received light intensity of −21 dBm is sufficient to provide a bit error rate of $1\times10^{-12}$ in case of "without another channel", a received light intensity of −20 dBm is needed to provide the bit error rate of $1\times10^{-12}$ in case of "with another channel".

As shown in FIG. 11, in the example#1, a received light intensity of −21 dBm is sufficient to provide the bit error rate of $1\times10^{-12}$, even in case of "with another channel".

As shown in FIG. 12, in the example#2, a received light intensity of −21 dBm is sufficient to provide the bit error rate of $1\times10^{-12}$, even in case of "with another channel".

Generally, although the received light intensity for providing the bit error rate of $1\times10^{-12}$ is defined as a minimum receiving sensitivity of the multi-channel optical receiver module, the minimum receiving sensitivity is decreased by crosstalk. Each length of arrows 100, 110, and 120 shown in FIGS. 10 to 12 indicates a decreasing range of the minimum receiving sensitivity by crosstalk. An effectiveness of the present invention is obvious by examining a difference of these lengths of arrows 100, 110, and 120.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

Further, it is noted that, Applicant's intent is to encompass equivalents of all claim elements, even if amended later during prosecution.

What is claimed is:

1. A multi-channel optical receiver module, comprising:
a light-receiving element array, the light-receiving element array including multiple light-receiving elements;
multiple sets of components assigned to the light-receiving elements, respectively;
each of the sets comprising:
an amplifier disposed adjacent to the light-receiving element array, the amplifier amplifying an output of a light-receiving element assigned thereto, the amplifier comprising two pads for bonding;
a wiring relay submount disposed adjacent to the amplifier;
two first wires for carrying a differential signal to be connected to the two pads of the amplifier by wire bonding and being disposed geometrically parallel to one another and being connected between the wiring relay submount and the amplifier;
a first output pin and a second output pin;

a second wire connecting between the amplifier and the light receiving element;
a first another wire connecting between the wiring relay submount and the first output pin; and
a second another wire connecting between the wiring relay submount and the second output pin; and
a substrate configured to support the light-receiving element array and the multiple sets of components on a planar surface thereof,
wherein the two first wires and the second wire are straight respectively and disposed nonparallel to each other when viewed in a plan view with respect to the planar surface of the substrate,
wherein the wiring relay submount is disposed on a first virtual straight line connected between the first output pin and the second output pin,
wherein the first output pin and the second output pin are located such that second and third virtual straight lines connected between the two pads and the first output pin and the second output pin, respectively, are located nonparallel,
wherein the first and second another wires are two straight wires that connect the wiring relay submount to the first output pin and the second output pin without conducting wire bonding on the second and third virtual straight lines connected between the two pads and the first output pin and the second output pin,
wherein the amplifier is not located on the first virtual straight line.

2. The multi-channel optical receiver module according to claim 1, wherein: the wiring relay submount comprises an electronic component that allows a noise amplitude of the two wires to be smaller than that of the another wire and the second another wire.

3. The multi-channel optical receiver module according to claim 2, wherein: the electronic component comprises a resistive element.

4. The multi-channel optical receiver module according to claim 2, wherein: the electronic component comprises one end electrically connected to the amplifier, and another end electrically connected to a fixed electric potential.

5. The multi-channel optical receiver module according to claim 4, wherein: the electronic component comprises a capacitive element.

6. The multi-channel optical receiver module according to claim 1, wherein: a wire length L1 between the wiring relay submount and the amplifier and a wire length L2 between at least one of the first output pin and the second output pin and the wiring relay submount have a relationship of L1>L2 in a case of no less than one channel.

7. The multi-channel optical receiver module according to claim 1, wherein said wiring relay submount is positioned substantially in a center between the first output pin and the second output pin.

8. The multi-channel optical receiver module according to claim 1, wherein the first another wire and the second another wire have substantially a same length.

9. The multi-channel optical receiver module of claim 1, wherein the first another wire directly connects the wiring relay submount and the first output pin, and the second another wire directly connects the wiring relay submount and the second output pin.

10. The multi-channel optical receiver module of claim 1, wherein the wiring relay submounts are disposed in a plurality of directions with respect to each other and positioned adjacent an outer circumferential portion of each amplifier.

11. The multi-channel optical receiver module of claim 1, wherein the wiring relay submount is located in a direction radially outward from the amplifier.

12. The multi-channel optical receiver module according to claim 1, wherein: the wiring relay submount is located on a center line between the second and third virtual straight lines.

13. A multi-channel optical receiver module, comprising:
a light-receiving element array, the light-receiving element array including multiple light-receiving elements;
multiple sets of components assigned to the light-receiving elements, respectively;
each of the sets comprising:
an amplifier disposed adjacent to the light-receiving element array, the amplifier amplifying an output of the light-receiving element assigned thereto, the amplifier comprising two pads for bonding;
a wiring relay submount disposed adjacent to the amplifier;
two first wires for carrying a differential signal to be connected to the two pads of the amplifier by wire bonding and being disposed geometrically parallel to one another and being connected between the wiring relay submount and the amplifier;
a first output and a second output pin;
a second wire connecting between the amplifier and the light receiving element;
a first another wire connecting between the wiring relay submount and the first output pin; and
a second another wire connecting between the wiring relay submount and the second output pin; and
a substrate configured to support the light-receiving element array and the multiple sets of components on a planar surface thereof,
wherein the two first wires are disposed at an oblique angle and non-parallel with respect to the second wire when viewed in a plan view with respect to the planar surface of the substrate,
wherein the wiring relay submount is disposed on a first virtual straight line connected between the first output pin and the second output pin,
wherein the first output pin and the second output pin are located such that second and third virtual straight lines connected between the two pads and the first output pin and the second output pin, respectively, are located nonparallel,
wherein the first and second another wires are two straight wires that connect the wiring relay submount to the first output pin and the second output pin without conducting wire bonding on the second and third virtual straight lines connected between the two pads and the first output pin and the second output pin,
wherein the amplifier is not located on the first virtual straight line.

14. The multi-channel optical receiver module according to claim 13, wherein: the wiring relay submount is located on a center line between the second and third virtual straight lines.

15. A multi-channel optical receiver module, comprising:
a light-receiving element array, the light-receiving element array including multiple light-receiving elements; and
multiple sets of components assigned to the light-receiving elements, respectively;
each of the sets comprising:
an amplifier disposed adjacent to the light-receiving element array, the amplifier amplifying an output of the light-receiving element assigned thereto, the amplifier comprising two pads for bonding;
a wiring relay submount disposed adjacent to the amplifier;
two first wires for carrying a differential signal to be connected to the two pads of the amplifier by wire bonding and being disposed geometrically parallel to one another and being connected between the wiring relay submount and the amplifier;
a first output pin and a second output pin;
a first another wire connecting between the wiring relay submount and the first output pin; and
a second another wire connecting between the wiring relay submount and the second output pin; and
a substrate configured to support the light-receiving element array and the multiple sets of components on a planar surface thereof,
wherein the wiring relay submount is disposed on a first virtual straight line connected between the first output pin and the second output pin,
wherein the first output pin and the second output pin are located such that second and third virtual straight lines connected between the two pads and the first output pin and the second output pin, respectively, are located non-parallel,
wherein the first and second another wires are two straight wires that connect the wiring relay submount to the first output pin and the second output pin without conducting wire bonding on the second and third straight lines connected between the two pads and the first output pin and the second output pin,
wherein the amplifier is not located on the first virtual straight line.

16. The multi-channel optical receiver module according to claim 15, wherein: the wiring relay submount is located on a center line between the second and third virtual straight lines.

* * * * *